(12) United States Patent  
Choudhury

(10) Patent No.: US 8,798,223 B2  
(45) Date of Patent: Aug. 5, 2014

(54) CLOCK AND DATA RECOVERY UNIT WITHOUT AN EXTERNAL REFERENCE CLOCK

(76) Inventor: Ashish K. Choudhury, Camarillo, CA (US)

( * ) Notice: Subject to any disclaimer, the term of this patent is extended or adjusted under 35 U.S.C. 154(b) by 616 days.

(21) Appl. No.: 12/977,995

(22) Filed: Dec. 23, 2010

(65) Prior Publication Data

US 2012/0163519 A1    Jun. 28, 2012

(51) Int. Cl.
*H04L 7/00* (2006.01)
*H04L 25/00* (2006.01)
*H04L 25/40* (2006.01)

(52) U.S. Cl.
USPC ............................................... 375/371

(58) Field of Classification Search
USPC .................................................. 375/371, 375
See application file for complete search history.

(56) References Cited

U.S. PATENT DOCUMENTS

| | | | | |
|---|---|---|---|---|
| 5,525,935 | A * | 6/1996 | Joo et al. | 331/11 |
| 6,842,049 | B2 * | 1/2005 | Totsuka | 327/40 |
| 2006/0215296 | A1 * | 9/2006 | Latchman | 360/51 |
| 2009/0153204 | A1 * | 6/2009 | Kawamoto et al. | 327/157 |
| 2011/0169535 | A1 * | 7/2011 | Kyles | 327/156 |

* cited by examiner

*Primary Examiner* — Chieh M Fan  
*Assistant Examiner* — Freshteh N Aghdam  
(74) *Attorney, Agent, or Firm* — Klein, O'Neil & Singh, LLP

(57) ABSTRACT

A clock and data recovery device receives a serial data stream and produces recovered clock and data signals. The clock and data recovery device operates over a range of frequencies and without use an external reference clock. A reference clock generator supplies a reference clock signal to a clock and data recovery module that uses the reference clock as a tuning or reference signal to produce the recovered clock and recovered data signals. The reference clock generator modifies the reference clock signal so that its frequency corresponds, within a small tolerance, to the data rate of the serial data stream. The reference clock generator determines a beat frequency between a voltage-controlled oscillator clock signal and the data rate and adjusts the voltage-controlled oscillator frequency, from which the reference clock is generated, to lower the beat frequency below a divided down version of the voltage-controlled oscillator clock.

26 Claims, 6 Drawing Sheets

CLOCK AND DATA RECOVERY UNIT WITHOUT AN EXTERNAL REFERENCE CLOCK

BACKGROUND OF THE INVENTION

The present invention relates generally to clock and data recovery circuits and, more particularly, to clock and data recovery circuits operable without an external reference clock.

Some communication systems transmit data serially over a channel such as a fiber optic cable. A transmitter in a serial communication system transmits data in a data signal with clocking information signaled implicitly by the timing of transitions in the data signal. A receiver recovers both the transmitted data and a corresponding clock signal. Circuitry in the receiver performing such operations is often termed a clock and data recovery circuit or more commonly a CDR. The clock and data recovery circuit commonly includes voltage-controlled oscillators, phase detectors, charge pumps, filters, and other circuitry of an analog or quasi-analog nature.

Many clock and data recovery circuits operate using a reference clock signal, for example, to aid in clock recovery by having a reference clock signal with a frequency close to some sub-multiple of the data rate. The reference clock signal may be used to tune or reduce an operating frequency range of circuitry in the clock and data recovery circuit. The reference clock signal often comes from a reference clock in the form of a crystal oscillator or similar precision source. Provisioning of the reference clock may be expensive, occupy a large space, or have other undesirable impacts.

In some applications, serial data may be received at different data rates with the receiver operating at corresponding different frequencies. In such applications, a CDR may be provided with multiple reference clock signals, one for each data rate, sourced from multiple reference clocks. This may substantially increase the expense of or space required for clock and data recovery circuits using external reference clock signals.

BRIEF SUMMARY OF THE INVENTION

The invention accordingly provides circuits and methods for clock and data recovery without external reference clock signals.

In one aspect the invention provides a clock and data recovery device, comprising: reference clock generator circuitry configured to receive a serial data signal and to produce a first clock signal oscillating at a frequency substantially proportional to a data rate of the serial data signal without utilizing an external reference clock signal; and clock and data recovery circuitry configured to receive the serial data signal and the first clock signal and produce a data output signal representing data recovered from the serial data signal and a second clock signal that is synchronous with the data output signal.

In another aspect the invention provides a reference clock generator device, comprising: a controlled oscillator configured to supply a first clock signal oscillating at a controlled frequency and utilized to produce a reference clock signal; a beat frequency generator configured to receive the serial data signal and the third clock signal and produce a beat frequency indicator indicating a difference between the data rate of the serial data signal and the frequency of the first clock signal; a first divider configured to receive the first clock signal and produce an output signal at a lower frequency; and a frequency difference detector configured to compare a frequency of the output signal of the divider and the beat frequency indicator and produce a frequency comparison indicator.

In another aspect the invention provides a method for use in recovering clock and data from a serial input signal, comprising: generating a variable clock signal oscillating at a frequency; dividing down the variable clock signal to produce a feedback clock signal oscillating at a lower frequency than the frequency of the variable clock signal; generating a beat frequency indicator indicating a difference between a data rate of the serial input signal and the frequency of the variable clock signal; comparing the frequency of the feedback clock signal to the beat frequency indicator to produce a frequency comparison indicator; and conditionally adjusting the frequency of the variable clock signal based on the frequency comparison indicator.

These and other aspects of the invention are more fully comprehended upon review of this disclosure.

DETAILED DESCRIPTION

Figure 1:
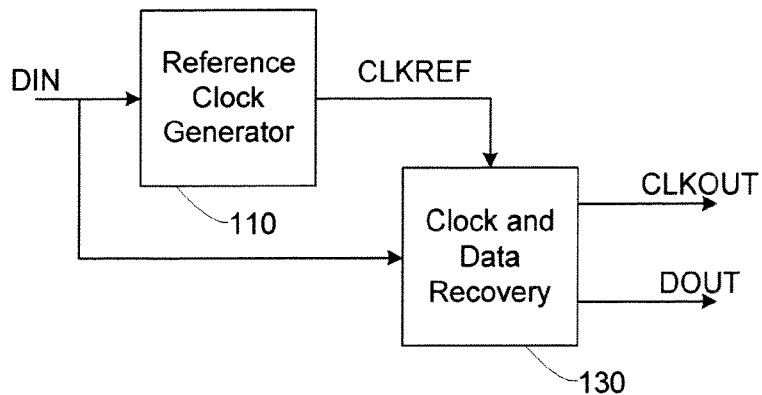
FIG. 1 is a block diagram of circuitry for clock and data recovery without use of an external reference clock signal in accordance with aspects of the invention.

FIG. 1 is a block diagram of circuitry for clock and data recovery without use of an external reference clock signal in accordance with aspects of the invention. Blocks of the circuitry are generally implemented with electronic circuitry and, for example, may be provided as a CMOS integrated circuit. The circuitry receives a serial input signal DIN that conveys a sequential stream of data bits from which is produced an output data signal DOUT and an associated output clock signal CLKOUT. The circuitry operates to produce the output data signal so that values in the output data signal substantially match values sent by a transmitter to produce the serial input signal and to produce the output clock signal synchronized with the output data signal. When operation of the circuitry is synchronized to the serial input signal, it is said to be locked.

The circuitry of FIG. 1 receives the serial input signal at any data rate within a range of operating data rates. For example, the circuitry may be operable at data rates ranging from 8 to 14 gigabits per second (Gbps). The circuitry adjusts its operation to match the rate at which data are received. The data rate may vary gradually over time, for example, changing by tens of parts per million, and when the circuitry is locked it tracks such timing changes. Preferably, the circuitry operates without external signaling, for example, an externally supplied data rate indicator, although software programming may be used to control operation of some of the circuitry.

The circuitry for clock and data recovery without use of an external reference clock signal includes a reference clock generator 110. The reference clock generator 110 receives the serial input signal and produces a reference clock signal CLKREF. The reference clock signal oscillates at a frequency derived from the data rate of the serial input signal. A controlled-frequency oscillator in the reference clock generator 110 may be used to produce the reference clock signal. The reference clock generator 110 adjusts the reference clock signal until its frequency is within a small tolerance, for example, 250 parts per million (ppm), of the data rate of the serial input signal.

The reference clock generator 110 compares the frequency of the reference clock to the data rate. When the frequency of the reference clock signal is substantially less than the data rate, the reference clock generator 110 increases the frequency; when the frequency of the reference clock signal is substantially greater than the data rate, it decreases the frequency; and when the frequency of the reference clock signal is substantially equal the data rate, it holds the frequency substantially stable. The range of frequencies of the reference clock signal that do not result in the reference frequency generator 110 adjusting the frequency may be considered a dead zone. The dead zone may improve jitter characteristics of the reference clock signal or locking time of the reference clock generator.

In some embodiments, the frequency of the reference clock signal is a harmonic or subharmonic of the data rate. For example, when the data rate is 10 Gbps, the frequency of the reference clock signal may be approximately 125 MHz. In such an embodiment, the reference clock generator 110 adjusts the reference clock signal until its frequency is within a small tolerance of one-eightieth the data rate of the serial input signal.

The circuitry for clock and data recovery without use of an external reference clock signal includes a clock and data recovery circuit 130. The clock and data recovery circuit 130 receives the serial input signal and the reference clock signal and produces the output data signal and the output clock signal. The clock and data recovery circuit 130 uses the reference clock signal as a tuning or reference signal to initialize or constrain its operating frequencies. For example, phase-locked loop circuitry in the clock and data recovery circuit 130 may include a controlled frequency oscillator that operates at a frequency that is driven toward the frequency of the reference clock signal and then locked to the serial input signal. Use of the reference clock signal may avoid a problem of a limited frequency acquisition range that may occur when using only the serial input signal. The phase-locked loop circuitry may additionally or alternatively be controlled to operate at frequencies that approximately match the frequency of the reference clock signal. In one embodiment, the clock and data recovery circuit 130 generates the output clock signal using phase interpolation. Clock signals of different phases may be generated from the reference clock signal, with the output clock signal formed by interpolating from the clock signals. The phase used for the interpolation is regularly adjusted so that the output clock signal locks to the serial input signal.

Figure 2:
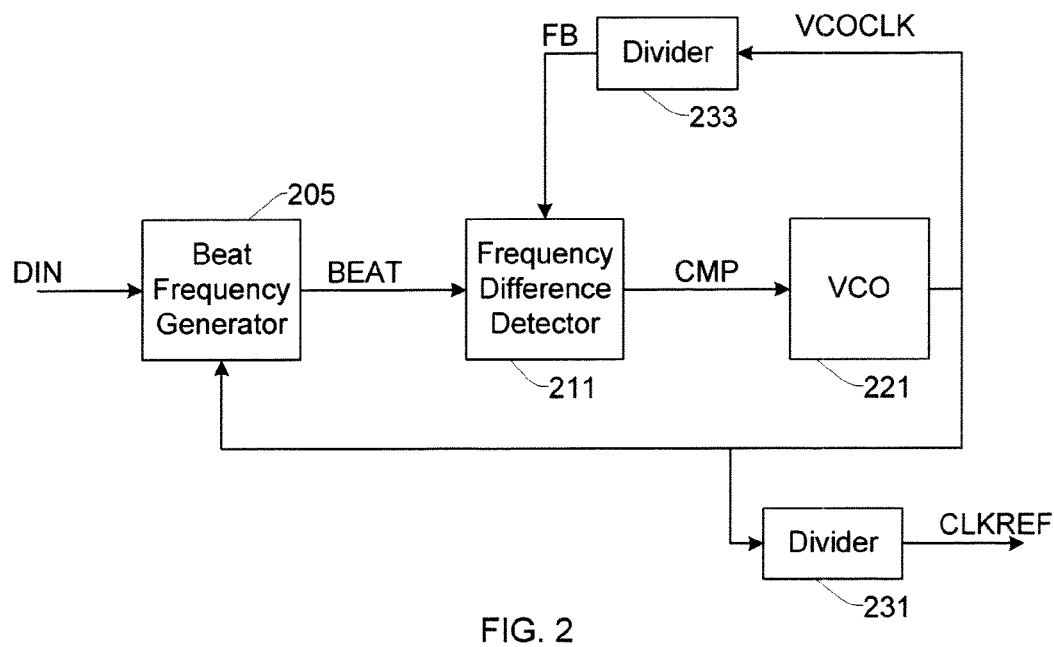
FIG. 2 is a block diagram of a reference clock generator circuit in accordance with aspects of the invention.

FIG. 2 is a block diagram of a reference clock generator circuit in accordance with aspects of the invention. The reference clock generator circuit of FIG. 2 may be used in some embodiments as the reference clock generator of the circuitry for clock and data recovery without use of an external reference clock signal of FIG. 1. The reference clock generator circuit receives a serial input signal DIN and produces a reference clock signal CLKREF that is approximately frequency locked to the data rate (or a harmonic or subharmonic thereof) of the serial input signal.

The reference clock generator circuit includes a voltage-controlled oscillator 221 that produces a VCO clock signal VCOCLK. The frequency of the VCO clock signal changes in response to a frequency comparison indicator CMP that is received by the voltage-controlled oscillator 221. In other embodiments, a current-controlled oscillator or another type of variable frequency oscillator may be used to produce the VCO clock signal. A filter may receive the frequency comparison indicator and produce a frequency control voltage signal. The filter generally provides low-pass filtering with the particular characteristics of the filter designed to provide a desired dynamic behavior of the VCO clock signal in combination with the characteristics of other blocks of the reference clock generator circuit. The reference clock generator circuit adjusts the frequency control signal so that frequency of the VCO clock signal approximately matches the data rate of the serial input signal.

In many embodiments, particularly those that operate at high frequencies, the VCO clock signal is a differential signal. Additionally, the VCO clock signal may include in-phase and quadrature clock signals. For example, differential in-phase and quadrature clock signals, in combination, provide signal transitions at 0, 90, 180, and 270 degrees of the period of the VCO clock signal. The in-phase and quadrature clock signals, in many embodiments, are produced from different stages of a ring oscillator circuit. The quadrature clock signal may also be produced by delaying the in-phase clock signal by one-quarter clock period. In some embodiments, the voltage-controlled oscillator 221 operates at a multiple or sub-multiple of the data rate, for example, the frequency of the VCO clock signal may be approximately one-half the data rate.

A feedback divider 233 receives the VCO clock signal and produces a feedback clock signal FB. The feedback divider 233 divides, for example, using a counter that counts transitions, the VCO clock signal by a value to produce the feedback clock signal. In some embodiments, the divisor value is a power of two, for example, 4096.

A beat frequency generator 205 receives the serial input signal and the VCO clock signal. The beat frequency generator 205 determines a difference between the data rate of the serial input signal and the frequency of the VCO clock signal and produces a beat frequency indicator BEAT indicating the relative frequencies. For example, when the data rate is 10 Gbps and the clock frequency is 9 GHz, the beat frequency indicator signals a difference of +1 GHz: and when the data rate is 10 Gbps and the clock frequency is 11 GHz, the beat frequency indicator signals a difference of −1 GHz.

A frequency difference detector 211 receives the beat frequency indicator and the feedback clock signal. When the magnitude of the beat frequency indicator is greater than the frequency of the feedback clock signal, the frequency difference detector 211 produces a frequency comparison indicator CMP to signal the voltage-controlled oscillator 221 to adjust the of the VCO clock signal; otherwise, the voltage-controlled oscillator 221 is signaled that its frequency should remain steady. When the beat frequency indicator is positive and has a magnitude greater than the frequency of the feedback clock signal, the frequency difference detector 211 produces the frequency comparison signal to signal the voltage-controlled oscillator 221 that the frequency of the VCO clock signal should be increased. When the beat frequency indicator is negative and has a magnitude greater than the frequency of the feedback clock signal, the frequency difference detector 211 produces the frequency comparison indicator to signal the voltage-controlled oscillator 221 that the frequency of the VCO clock signal should be increased.

An output divider 231 receives the VCO clock signal and produces the reference clock signal. The output divider 231 divides the VCO clock signal by a value to produce the reference clock signal, for example, by using a counter that counts rising or falling transitions of the VCO clock signal. In some embodiments, the divisor value is one and the output divider 231 may operate as a connection or buffer from the VCO clock signal to the reference clock signal. Some circuitry may be common to the output divider 231 and the feedback divider 233. For example, in an embodiment where the divisor for the feedback divider 233 is a multiple of the divisor for the output divider 231, the feedback divider 233 may receive the reference clock signal rather than the VCO clock signal and use a correspondingly reduced divisor value.

Operation of the reference clock generator circuit may be further understood with reference to an embodiment having a divisor of 4000 for the feedback divider 233 and a voltage-controlled oscillator 221 operable over a range from 8 to 14 GHz that receives a serial input signal having a data rate of 10 GHz.

At one extreme, the frequency of the VCO clock signal may be at its minimum, 8 GHz. The beat frequency generator 205 will determine that the frequency of the VCO clock signal is less than the data rate of the serial input signal and produce a beat frequency indicator of +2 GHz (10 GHz-8 GHz). The frequency of the feedback clock signal will be the VCO frequency divided by the feedback divisor, that is, the frequency of the feedback clock signal will be 2 MHz (8 GHz/4000). Accordingly the frequency difference detector 211 will determine that the beat frequency indicator is positive and has a magnitude greater than the frequency of the feedback clock signal and produce the frequency comparison indicator with a value to signal the voltage-controlled oscillator 221 to increase its frequency.

As the VCO frequency increases, the frequency of the feedback clock signal increases and the beat frequency indicator decreases, with the change in the beat frequency indicator is much greater than the change in the feedback clock signal. For example, when the frequency of the VCO clock signal has increased to 9.6 GHz, the frequency of the feedback clock signal will be 2.4 MHz (9.6 GHz/4000) and the beat frequency indicator will be 400 MHz (10 GHz-9.6 GHz).

The reference clock generator circuit will continue increasing the VCO frequency until it is within a small tolerance of the data rate. When the frequency of the VCO clock signal has increased to 9.9975 GHz, the frequency of the feedback clock signal will be ≈2.499 MHz (9.9975 GHz/4000) and the beat frequency indicator will be +2.5 MHz (10 GHz-9.9975 GHz). Since the magnitude of the beat frequency indicator essentially equals the frequency of the feedback clock signal, the VCO frequency has approximately locked to the data rate of the serial input signal and the reference clock signal may be used, for example, by a clock and data recovery module to recover data.

In a final example, when the frequency of the VCO clock signal has increased to 9.999 GHz, the frequency of the feedback clock signal will be ≈2.5 MHz (9.999 GHz/4000) and the beat frequency indicator will be 1 MHz (10 GHz-9.999 GHz). Accordingly, the frequency difference detector 211 will determine that the magnitude of the beat frequency indicator is lower than the frequency of the feedback clock signal and will signal that the VCO frequency should not be adjusted.

At the other extreme, the frequency of the VCO clock signal may be at its maximum, 14 GHz. The beat frequency generator 205 will determine that the frequency of the VCO clock signal is greater than the data rate of the serial input signal and produce a beat frequency indicator of −4 GHz (10 GHz-14 GHz). The frequency of the feedback clock signal will be the VCO frequency divided by the feedback divisor, that is, the frequency of the feedback clock signal will be 3.5 MHz (14 GHz/4000). Accordingly the frequency difference detector 211 will determine that the beat frequency indicator is negative and has a magnitude greater than the frequency of the feedback clock signal and produce the frequency comparison indicator with a value to signal the voltage-controlled oscillator 221 to decrease its frequency.

As the VCO frequency decreases, the frequency of the feedback clock signal and the magnitude of the beat frequency indicator decrease, although the change in the beat frequency indicator is much greater than the change in the feedback clock signal. For example, when the frequency of the VCO clock signal has decreased to 10.4 GHz, the frequency of the feedback clock signal will be 2.6 MHz (10.4 GHz/4000) and the beat frequency indicator will be −400 MHz (10 GHz-10.4 GHz).

The reference clock generator circuit will continue decreasing the VCO frequency until it is within a small tolerance of the data rate. When the frequency of the VCO clock signal has decreased to 10.0025 GHz, the frequency of the feedback clock signal will be ≈2.501 MHz (10.0025 GHz/4000) and the beat frequency indicator will be 2.5 MHz (10 GHz-10.0025 GHz). Since the magnitude of the beat frequency indicator essentially equals the frequency of the feedback clock signal, the VCO frequency has approximately locked to the data rate of the serial input signal and the reference clock signal may be used, for example, by a clock and data recovery module to recover data.

Thus it is seen that the reference clock generator circuit will produce the VCO clock signal at a frequency within a small tolerance of the data rate of the serial input signal and thus produce the clock reference signal, which is produced from the VCO clock signal, that may be used as a reference clock by a clock and data recovery module that also receives the serial input signal. The small tolerance, or dead zone, in some embodiments may be related to the reciprocal of the divisor value in the feedback divider 233.

Figure 3:
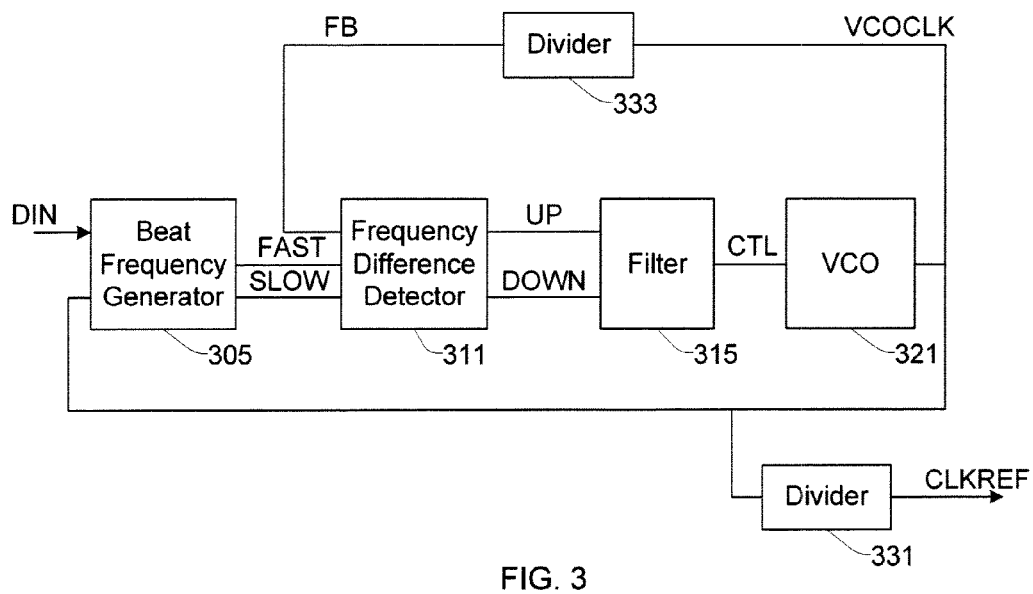
FIG. 3 is a block diagram of another reference clock generator circuit in accordance with aspects of the invention.

FIG. 3 is a block diagram of another reference clock generator circuit in accordance with aspects of the invention. The reference clock generator circuit of FIG. 3 may be used in some embodiments as the reference clock generator of the circuitry for clock and data recovery without use of an external reference clock signal of FIG. 1. The reference clock generator circuit receives a serial input signal DIN and produces a reference clock signal CLKREF that is approximately frequency locked to the data rate (or a harmonic or subharmonic thereof) of the serial input signal.

The reference clock generator circuit includes a voltage-controlled oscillator 321 that produces a VCO clock signal VCOCLK. The frequency of the VCO clock signal is controlled by a frequency control signal CTL that is received by the voltage-controlled oscillator 321. In other embodiments, a current-controlled oscillator or another type of variable frequency oscillator may be used to produce the VCO clock signal. The reference clock generator circuit adjusts the frequency control signal so that frequency of the VCO clock signal approximately matches the data rate of the serial input signal. As with the voltage-controlled oscillator of FIG. 2, in many embodiments, the VCO clock signal is a differential signal, and the VCO clock signal may include in-phase and quadrature clock signals, and the VCO may operate at a multiple or subrate of the data rate.

An output divider 331 receives the VCO clock signal and produces the reference clock signal. A feedback divider 333 receives the VCO clock signal and produces a feedback clock signal FB. The output divider 331 and feedback divider 333 may be similar to or the same as the output divider and the feedback divider of FIG. 2.

A beat frequency generator 305 receives the serial input signal and the VCO clock signal. The beat frequency generator 305 detects the difference between the data rate of the serial input signal and the frequency of the VCO clock signal and produces output signals indicating the relative frequencies. As illustrated in FIG. 3, the relative frequencies may be indicated by a fast difference signal FAST that pulses when the VCO clock signal is faster than the serial input signal and a slow difference signal SLOW that pulses when the VCO clock signal is slower than the serial input signal. The slow difference signal generally remains at a stable value when the VCO clock signal is faster than the serial input signal; however, there may be occasional pulses on the slow difference signal due, for example, to timing jitter on the serial input signal or the VCO clock signal. Likewise, the fast difference signal generally remains at a stable value when the VCO clock signal is slower than the serial input signal but may contain occasional pulses. In other embodiments, one signal may indicate the frequency with a second signal indicating which of the signals is slower.

The difference signals may be termed beat frequency signals by analogy to beating that is perceived when two sounds of slightly different frequencies interfere. In one embodiment, when the frequency $f_{vco}$ of the VCO clock signal is higher than the data rate $f_{data}$ of the serial input signal, the fast difference signal oscillates at a frequency of $f_{vco}-f_{data}$; and when the frequency $f_{vco}$ of the VCO clock signal is lower than the data rate $f_{data}$ of the serial input signal, the slow difference signal oscillates at a frequency of $f_{data}-f_{vco}$. In many embodiments, the frequencies at which the fast and slow difference signals oscillate may be less than the difference between $f_{vco}$ and $f_{data}$, particularly when the difference is a large fraction of the data rate. In some embodiments, frequencies of the difference signals are scaled relative to the frequency differences, for example, the frequency of the slow difference signal may be $(f_{data}-f_{vco})/2$.

A frequency difference detector 311 receives the slow and fast frequency difference signals and the feedback clock signal. When the frequency of the fast frequency difference signal is higher than the frequency of the feedback clock signal, the frequency difference detector 311 asserts a down comparison signal DOWN to indicate that the frequency of the VCO clock signal should be decreased. When the frequency of the slow frequency difference signal is higher than the frequency of the feedback clock signal, the frequency difference detector 311 asserts an up comparison signal UP to indicate that the frequency of the VCO clock signal should be increased. When the frequency of the slow frequency difference signal and the frequency of the fast difference signal are lower than the frequency of the feedback clock signal, neither the up comparison signal up nor the down comparison signal is asserted indicating that the frequency of the VCO clock signal should remain steady. In some embodiments, both comparison signals are asserted when the frequency of the VCO clock signal should remain steady.

In one embodiment, the frequency difference detector 311 includes three counters: one that counts rising edges of the fast frequency difference signal, one that counts rising edges of the slow frequency difference signal, and one that counts rising edges of the feedback clock signal. For example, each counter may be reset to zero, or some other appropriate value depending on the counter, at the same time and count to their respective limit values on the rising edges of its respective input signal. By detecting which of the counters reaches its limit first, the relative frequencies of the input signals to the frequency difference detector 311 may be determined and the corresponding comparison signals asserted.

A filter 315 receives the frequency comparison signals and produces the frequency control signal based on the received signals. The filter 315 generally provides low-pass filtering with the particular characteristics of the filter designed to provide a desired dynamic behavior of the VCO clock signal, for example, a certain time-rate of change in frequency. For example, the reference clock generator circuit may behave as a second-order system that has a desired natural frequency and damping based on the filter characteristics in combination with the characteristics of other blocks of the reference clock generator circuit. In many embodiments, the filter 315 includes a charge pump circuit. The charge pump circuit supplies a charge to other circuitry of the filter with the polarity of the charge varying with which of the comparison signals is active and the amount of charge varying with the duration of the comparison signals although the filter 315 is configured to hold the frequency control signal stable when the comparison signals have the same value, small changes may occur, for example, due mismatches or leakage currents in circuit elements of the filter.

Operation of the reference clock generator circuit may be further understood with reference to an embodiment having a divisor of 4000 for the feedback divider 333 and a voltage-controlled oscillator 321 operable over a range from 8 to 14 GHz that receives a serial input signal having a data rate of 10 GHz.

At one extreme, the frequency of the VCO clock signal may be at its minimum, 8 GHz. The beat frequency generator 305 will determine that the frequency of the VCO clock signal is less than the data rate of the serial input signal and produce a slow difference signal oscillating at 2 GHz and a fast difference signal that is essentially static. The frequency of the feedback clock signal will be the VCO frequency divided by the feedback divisor, that is, the frequency of the feedback clock signal will be 2 MHz. Accordingly the frequency difference detector 311 will determine that the frequency of the slow comparison signal is greater than the frequency of the feedback clock signal and assert the up comparison signal. The filter 315 adjusts the frequency control signal to increase the frequency of the voltage-controlled oscillator 321. As the VCO frequency increases, the frequency of the feedback clock signal increases and the frequency of the slow difference signal decreases, although the change in the slow difference signal is much greater than the change in the feedback clock signal. The reference clock generator circuit will continue increasing the VCO frequency until it is within a small tolerance of the data rate as indicated by the frequency of the slow difference signal being less than the frequency of the feedback clock signal. Since the VCO frequency has approximately locked to the data rate of the serial input signal, the reference clock signal, which is produced from the VCO clock signal, may be used, for example, by a clock and data recovery module to recover data.

At the other extreme, the frequency of the VCO clock signal may be at its 14 GHz. The beat frequency generator 305 will determine that the frequency of the VCO clock signal is greater than the data rate of the serial input signal and produce a fast difference signal oscillating at 4 GHz and a slow difference signal that is essentially static. The frequency of the feedback clock signal will be the VCO frequency divided by the feedback divisor, that is, the frequency of the feedback clock signal will be 3.5 MHz. Accordingly the frequency difference detector 311 will determine that the frequency of the fast comparison signal is greater than the frequency of the feedback clock signal and assert the down comparison signal. The filter 315 adjusts the frequency control signal to decrease the frequency of the voltage-controlled oscillator 321. As the VCO frequency decreases, the frequency of the feedback clock signal and the frequency of the fast difference signal decrease, although the change in the fast difference signal is much greater than the change in the feedback clock signal. The reference clock generator circuit will continue decreasing the VCO frequency until it is within a small tolerance of the data rate as indicated by the frequency of the fast difference signal being less than the frequency of the feedback clock signal. Since the VCO frequency has approximately locked to the data rate of the serial input signal, the reference clock signal may be used, for example, by a clock and data recovery module to recover data.

Thus it is seen that the reference clock generator circuit will produce the VCO clock signal at a frequency within a small tolerance of the data rate of the serial input signal and thus produce the clock reference signal, which is produced from the VCO clock signal, that may be used as a reference clock by a clock and data recovery module that also receives the serial input signal. The small tolerance, or dead zone, depends on the reciprocal of the divisor value in the feedback divider 333.

Figure 4:
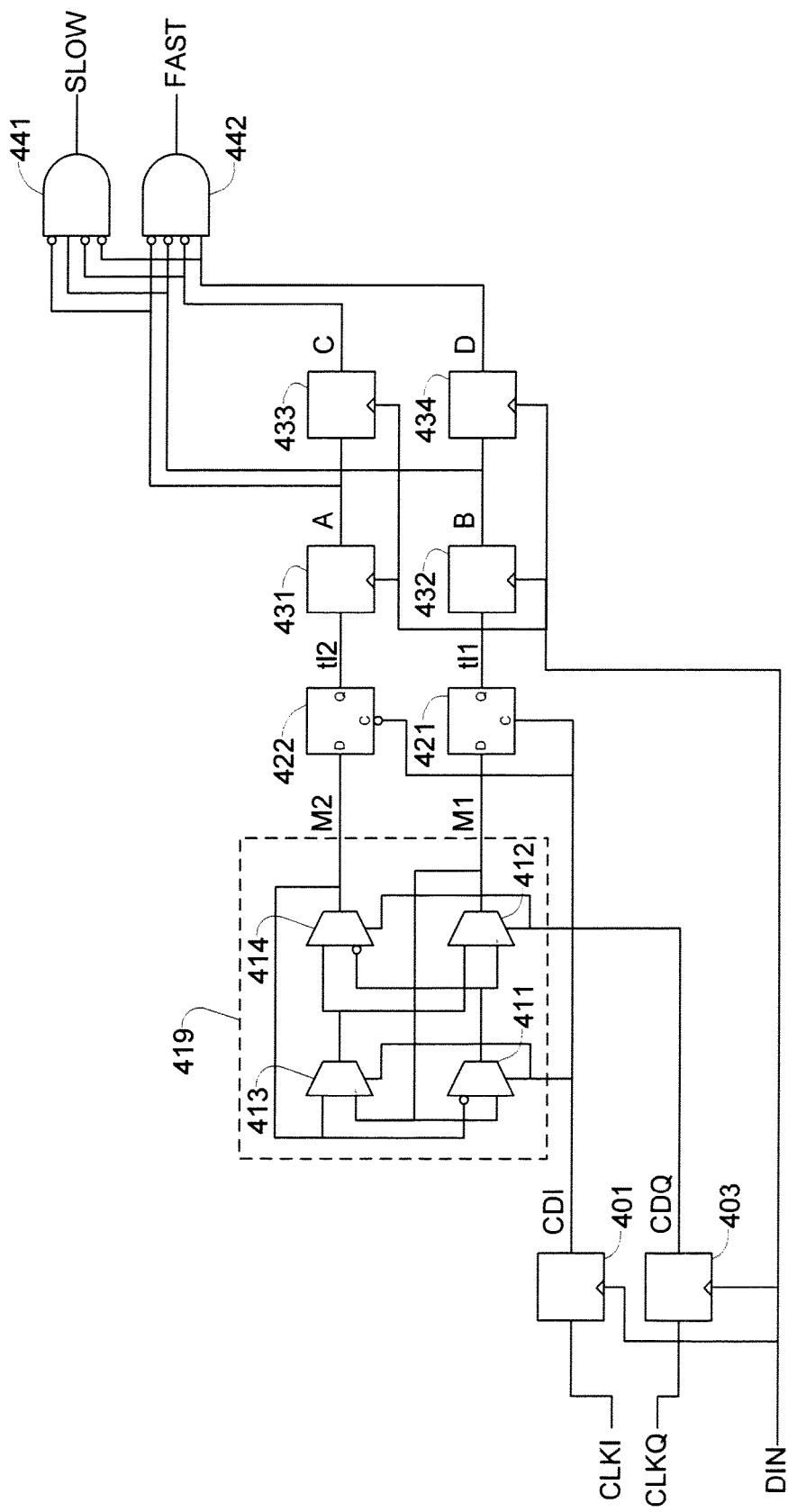
FIG. 4 is a block diagram of a quadricorrelator circuit in accordance with aspects of the invention.

FIG. 4 is a block diagram of a quadricorrelator circuit in accordance with aspects of the invention. The quadricorrelator circuit of FIG. 4 may be used in some embodiments as the beat frequency generator of the reference clock generator circuit of FIG. 3. The quadricorrelator circuit receives a serial input signal DIN and two clock signals: an in-phase clock signal CLKI and a quadrature clock signal CLKQ. The quadrature clock signal lags the in-phase clock signal by one-quarter cycle. The quadricorrelator circuit produces a fast difference signal FAST that pulses when the frequency of the clock signals is greater than the data rate of the serial input signal and a slow difference signal SLOW that pulses when the frequency of the clock signals is less than the data rate of the serial input signal. In the embodiment of FIG. 4, the frequency of the difference signals is one-half the difference between the clock frequency and the data rate.

The quadricorrelator circuit includes a first input flip-flop 401 that samples and stores the value of the in-phase clock signal and a second input flip-flop 403 that samples and stores the value of the quadrature clock signal. Rising edges of the serial input signal trigger operation of the flip-flops. On the rising edge of the serial input signal, the first input flip-flop 401 samples the value of the in-phase clock signal and drives the value to its output to produce an in-phase sample CDI. On the rising edge of the serial input signal, the second input flip-flop 403 samples the value of the quadrature clock signal and drives the value to its output to produce a quadrature sample CDQ. In other embodiments, the input flip-flops may be triggered by falling edges or both edges of the serial input signal.

Figure 5:
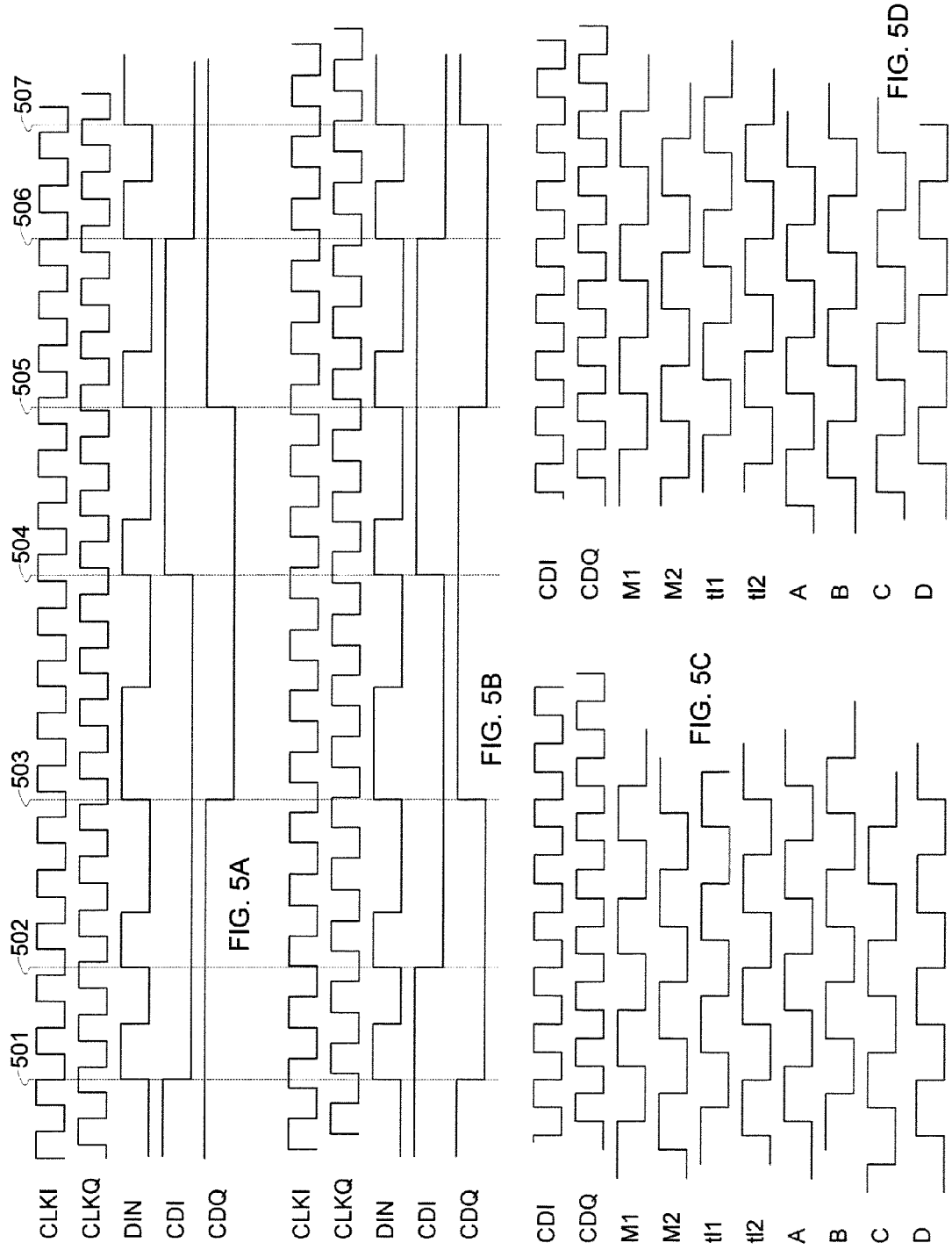
FIGS. 5A-D are waveform diagrams illustrating operation for a quadricorrelator circuit in accordance with aspects of the invention.

Operation of the input flip-flops may be further understood with reference to FIG. 5A and FIG. 5B which are waveform diagrams. Included in the diagrams are the input signals to the quadricorrelator circuit: in-phase clock signal, the quadrature clock signal, and the serial input signal; and the outputs of the input flip-flops: the in-phase sample and the quadrature sample. The clock signals have the quadrature relationship with the quadrature clock signal lagging the in-phase clock signal my one-quarter cycle. The serial input signal includes seven rising edges that trigger the input flip-flops occurring at times 501-507.

The waveform diagram of FIG. 5A illustrates operation of the input flip-flops when the clock frequency is greater than the data rate. At the first rising edge of the serial input signal, time 501, the in-phase clock signal is low and the quadrature clock signal is high; thus, the in-phase sample has a low value and the quadrature sample has a high value. At the second rising edge of the serial input signal, time 502, the in-phase clock signal is low and the quadrature clock signal is high; thus, the in-phase sample remains low and the quadrature sample remains high. At the third rising edge of the serial input signal, time 503, the in-phase clock signal is low and the quadrature clock signal is low; thus, the in-phase sample remains low and the quadrature sample has a low value. At the fourth rising edge of the serial input signal, time 504, the in-phase clock signal is high and the quadrature clock signal is low; thus the in-phase sample has a high value and the quadrature sample remains low. At the fifth rising edge of the serial input signal, time 505, the in-phase clock signal is high and the quadrature clock signal is high; thus the in-phase sample remains high and the quadrature sample has a high value. At the sixth rising edge of the serial input signal, time 506, the in-phase clock signal is low and the quadrature clock signal is high; thus, the in-phase sample has a low value and the quadrature sample remains high.

Similar sampling of the clock signals occurs on each subsequent rising edge of the serial input signal. Thus, the values of the in-phase sample and quadrature sample as shown from time 501 to time 506 repeat. However, the timing of transitions of the in-phase sample and the quadrature sample may vary with the sequence of values in the serial input signal. Since the frequency of the clock signals is greater than the data rate, the sample precesses through phases of the clock signals in a positive direction. Accordingly, the in-phase sample leads the quadrature sample.

The waveform diagram of FIG. 5B illustrates operation of the input flip-flops when the clock frequency is less than the data rate. At the first rising edge of the serial input signal, time 501, the in-phase clock signal is high and the quadrature clock signal is low; thus, the in-phase sample has a high value and the quadrature sample has a low value. At the second rising edge of the serial input signal, time 502, the in-phase clock signal is low and the quadrature clock signal is low; thus, the in-phase sample has a low value and the quadrature sample remains low. At the third rising edge of the serial input signal, time 503, the in-phase clock signal is low and the quadrature clock signal is high; thus, the in-phase sample remains low and the quadrature sample has a high value. At the fourth rising edge of the serial input signal, time 504, the in-phase clock signal is high and the quadrature clock signal is high; thus, the in-phase sample has a high value and the quadrature sample remains high. At the fifth rising edge of the serial input signal, time 505, the in-phase clock signal is high and the quadrature clock signal is low; thus, the in-phase sample remains high and the quadrature sample has a low value.

Similar sampling of the clock signals occurs on each subsequent rising edge of the serial input signal. Thus, the values of the in-phase sample and quadrature sample as shown from time 501 to time 505 repeat. Since the frequency of the clock signals is less than the data rate, the sample precesses through phases of the clock signals in a negative direction. Accordingly, the in-phase sample lags the quadrature sample.

Considering FIGS. 5A and 5B, it is seen that the quadrature sample lags the in-phase sample when the clock frequency is greater than the data rate, and the quadrature sample leads the in-phase sample when the clock frequency is less than the data rate.

The in-phase sample and the quadrature sample are supplied to a mobius circuit 419. The mobius circuit 419 produces a first mobius output M1 and a second mobius output M2 that switch at one-half the frequency of the in-phase sample and the quadrature sample and that may have improved timing characteristics, for example, less sensitivity to jitter. The mobius circuit 419 includes four multiplexers 411-414. The multiplexers may be considered as a shift register with the direction shifted depending on the sequence of the in-phase sample and the quadrature sample.

The first multiplexer 411 selects the value of its output based on the value of the in-phase sample. When the in-phase sample is a ONE, the output is selected to be the value of the output of the second multiplexer 412; and when the in-phase sample is a ZERO, the output is selected to be the inverse of the value of the output of the fourth multiplexer 414.

The second multiplexer 412 selects the value of its output based on the value of the quadrature sample. When the quadrature sample is a ONE, the output is selected to be the value of the output of the first multiplexer 411; and when the quadrature sample is a ZERO, the output is selected to be the value of the output of the third multiplexer 413. The output of the second multiplexer 412 supplies the first mobius output.

The third multiplexer 413 selects the value of its output based on the value of the in-phase sample. When the in-phase sample is a ONE, the output is selected to be the value of the output of the second multiplexer 412; and when the in-phase sample is a ZERO, the output is selected to be the value of the output of the fourth multiplexer 414.

The fourth multiplexer 414 selects the value of its output based on the value of the quadrature sample. When the quadrature sample is a ONE, the output is selected to be the inverse of the value of the output of the first multiplexer 411; and when the quadrature sample is a ZERO, the output is selected to be the value of the output of the third multiplexer 413. The output of the fourth multiplexer 414 supplies the second mobius output.

Operation of the mobius circuit 419 may be further understood with reference to FIG. 5C and FIG. 5D which are waveform diagrams. Included in the diagrams are the input signals to the mobius circuit: the in-phase sample and the quadrature sample; and the outputs of the mobius circuit: the first mobius output and the second mobius output.

The waveform diagram of FIG. 5D illustrates operation of the mobius circuit when the clock frequency is greater than the data rate. The in-phase sample and the quadrature sample have the quadrature timing relationship illustrated in FIG. 5A with the in-phase sample leading the quadrature sample. Accordingly, the mobius circuit shifts values from the fourth multiplexer 414 to the third multiplexer 413 to the second multiplexer 412 to the first multiplexer 411 and back to the fourth multiplexer 414. Thus, the first mobius output lags the second mobius output with both signals transitioning on transitions of the quadrature sample.

The waveform diagram of FIG. 5C illustrates operation of the mobius circuit when the clock frequency is less than the data rate. The in-phase sample and the quadrature sample have the quadrature timing relationship illustrated in FIG. 5B with the in-phase sample lagging the quadrature sample. Accordingly, the mobius circuit shifts values from the first multiplexer 411 to the second multiplexer 412 to the third multiplexer 413 to the fourth multiplexer 414 to and back to the first multiplexer 411. Thus, the first mobius output leads the second mobius output with both signals transitioning on transitions of the quadrature sample.

The outputs of the mobius circuit 419 are retimed by a set of latches and flip-flops. A first transparent latch 421 receives as an input the first mobius output and supplies the value from its input to its output when enabled by a ONE value of the in-phase sample and holds the output value when not enabled. A second transparent latch 422 receives as an input the second mobius output and supplies the value from its input to its output when enabled by a ZERO value of the in-phase sample and holds the output value when not enabled. The output of the second transparent latch 422 is registered by a first retiming flip-flop 431 to produce a first retimed signal A. The output of the first transparent latch 421 is registered by a second retiming flip-flop 432 to produce a second retimed signal B. The output of the first retiming flip-flop 431, the first retimed signal, is registered by a third retiming flip-flop 433 to produce a third retimed signal C. The output of the second retiming flip-flop 432, the second retimed signal, is registered by a fourth retiming flip-flop 434 to produce a fourth retimed signal D. Each of the retiming flip-flops is triggered by rising edges of the serial input signal.

Operation of the retiming circuit may be further understood with reference to FIG. 5C and FIG. 5D. The waveform diagrams additionally include the retimed signals: the first transparent latch's 421 output tl1, the second transparent latch's 422 output tl2, the first retimed signal, the second retimed signal, the third retimed signal, and the fourth retimed signal.

FIG. 5C illustrates operation of the retiming circuit when the clock frequency is less than the data rate. The first transparent latch 421 passes the first mobius output when the in-phase sample is high. Since the in-phase sample is not high during transitions of the first mobius output, the latch output tl1 is delayed from its input. Similarly, the second transparent latch 422 passes the second mobius output when the in-phase sample is low and the in-phase sample is not low during transitions of the second mobius output, the latch output tl2 is delayed from its input. Since the first through fourth retimed signals are supplied by flip-flops triggered by rising edges the serial input signal, which also triggers the in-phase sample and the quadrature sample, transitions of the latch outputs tl1, tl2 will be delayed by circuit delays from the edges of the serial input signal that triggered the transitions. Thus, the output of each retiming flip-flop is delayed until the next rising edge of the serial input signal. As illustrated, the first retimed signal follows the second latch output tl2 and is followed by the third retimed signal. The second retimed signal follows the first latch output tl1 and is followed by the fourth retimed signal.

FIG. 5D illustrates operation of the retiming circuit when the clock frequency is greater than the data rate. The signal waveforms are similar to those described for FIG. 5C but with a different sequence of retimed outputs due to the differing timing of the inputs to the mobius circuit.

The retimed signals are decoded to produce the difference signals. A first AND gate 441 produces the slow difference signal as its output. The first AND gate 441 asserts a ONE output when the second retimed signal is ONE and the other retimed signals are ZERO. As illustrated in FIG. 5D and FIG. 5C, the combination of the retimed signals decoded by the first AND gate 441 occurs when clock signals are slower than the data rate but not when the clock signals are faster than the data rate. A second AND gate 442 produces the fast difference signal as its output. The second AND gate 442 asserts a ONE output when the fourth retimed signal is ONE and the other retimed signals are ZERO. As illustrated in FIG. 5D and FIG.

5C, the combination of the retimed signals decoded by the second AND gate 442 occurs when clock signals are faster than the data rate but not when the clock signals are slower than the data rate. In other embodiments, alternative decodings of the retimed signals may be used, for example, the inverse of the illustrated decoding.

The input flip-flops, mobius circuit, retiming circuit, and decoding logic gates, in combination, produce difference signals that pulse at one-half the beat frequency between the frequency of the clock signals and the data rate of the serial input signal. When the clock frequency $f_{CLK}$ is greater than the data rate $f_D$, the fast difference signal pulses at a frequency $(f_{CLK}-f_D)/2$. When the clock frequency $f_{CLK}$ is less than the data rate $f_D$, the slow difference signal pulses at a frequency $(f_D-f_{CLK})/2$. When used in the beat frequency generator of the reference clock generator circuit of FIG. 3, the divide by two in the frequency of the difference signals increases the small tolerance of the frequency of the reference clock signal. An embodiment of the reference clock generator circuit may, accordingly, increase the value of the divisor of the feedback divider by a factor of two.

The quadricorrelator circuit illustrated in FIG. 4 is simplified for clarity of description. In many embodiments, the quadricorrelator circuit includes additional devices, for example, buffer circuits to drive the various signals with timing characteristics that will provide the desired operation. In some embodiments, blocks of the quadricorrelator circuit may be repeated with different ones of the blocks designed for different operating frequencies. Additionally, the quadricorrelator circuit may use current-mode logic and include a pair of differential signal lines for each of the illustrated signals.

Figure 6:
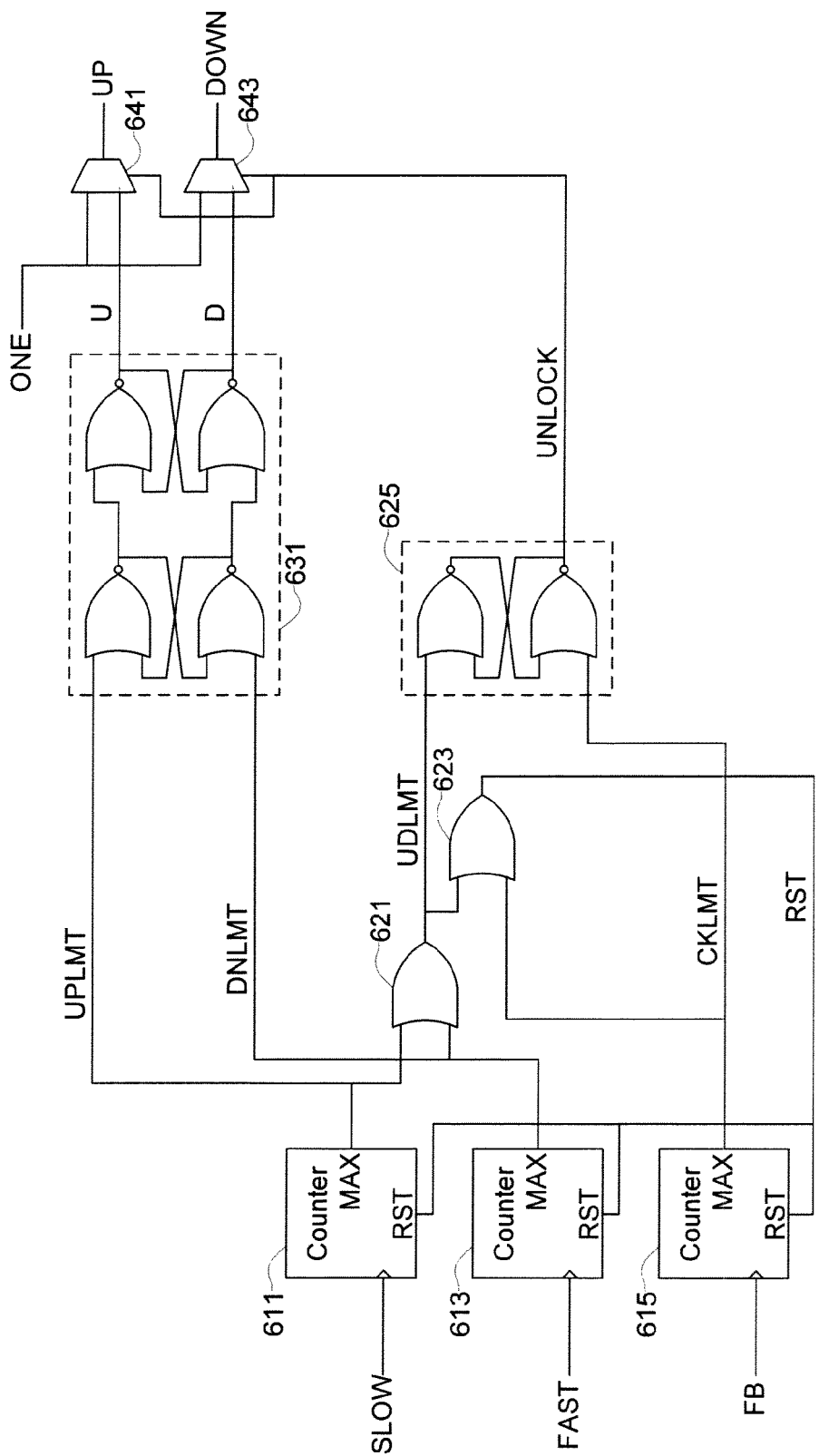
FIG. 6 is a block diagram of a frequency difference detector circuit in accordance with aspects of the invention.

FIG. 6 is a block diagram of a frequency difference detector circuit in accordance with aspects of the invention. The frequency difference detector circuit of FIG. 6 may be used in some embodiments as the frequency difference detector of the reference clock generator of FIG. 3. The frequency difference detector circuit receives a slow difference signal SLOW, a fast difference signal FAST, and a feedback clock signal FB. The received signals may be supplied by the beat frequency generator of the reference clock generator circuit illustrated in FIG. 3. Accordingly, the slow difference signal signals how much slower a VCO clock signal is than a received data rate, the fast difference signal signals how much faster the VCO clock signal is than the received data rate, and the feedback clock signal signals a desired maximum difference between the frequency of the VCO clock signal and the received data rate. The frequency difference detector circuit determines the relative frequencies of the input signals and produces an up comparison signal UP and a down comparison signal DOWN. The comparison signals may be filtered to control a voltage-controlled oscillator as in the reference clock generator circuit illustrated in FIG. 3.

The frequency difference detector circuit includes a slow counter 611 that counts rising transitions of the slow difference signal, a fast counter 613 that counts rising transitions of the fast difference signal, and a clock counter 615 that counts rising transitions of the feedback clock signal. Each counter resets its count to zero when a reset signal RST is asserted. Each counter has an output that is asserted when the counter reaches a limit value, for example, ten. The slow counter 611 asserts an up limit signal UPLMT when its count value reaches the limit. The fast counter 613 asserts a down limit signal DNLMT when its count value reaches the limit. The clock counter 615 asserts a clock limit signal CKLMT when its count value reaches the limit. In most embodiments, the counters count to the same limit value. In some embodiments, the limits may be different between the counters and the frequency comparisons performed by the frequency difference detector circuit are correspondingly ratioed. In some embodiments, the counters may count on falling transitions or rising and falling transitions of their respective inputs. The counters may also reset to a maximum count and count down toward zero with the limit outputs asserted accordingly.

The limit outputs from the counters are logically combined to produce the reset signal. A first OR gate 621 logically ORs the up limit signal and the down limit signal to produce an up-down limit signal UDLMT. A second OR gate 623 logically ORs the up-down limit signal and the clock limit signal to produce the reset signal. Thus, the limit signal is the logical OR of the up limit signal, the down limit signal, and the clock limit signal. Accordingly, all of the counters are reset when any of the counters reaches its limit value.

Since the counters are reset at the same time, ordinarily, only the counter triggered by the highest frequency signal among the slow difference signal, the fast difference signal, and the feedback clock signal will reach its maximum count value and assert its limit output. The counters that are triggered by slower signals will not, ordinarily, assert their limit outputs because the reset signal will occur before they reach their maximum count value. It is noted that in some embodiments, a counter triggered by a slower signal may occasionally assert its limit output depending on the relative phases of the triggering signals. However, such occasional assertions generally are insignificant and do not overly negatively impact circuit operation, and may be reduced, for example, through the use of higher count values. Moreover, with use of the frequency difference detector circuit in the reference clock generator of FIG. 3, the frequency of the feedback clock signal will be adjusted so that occurrence of the occasionally asserted limit output triggered by the slower signal is gradually removed.

A first set-reset latch 625 provides lock detection. The first set-reset latch 625 produces an unlocked signal UNLOCK that is ONE when the frequency difference detector circuit determines that the frequency of the slow difference signal or the frequency of the fast difference signal is higher than the frequency of the feedback clock signal FB. The unlocked signal is ZERO when the frequency difference detector circuit determines that the frequency of the feedback clock signal is higher than both the frequency of the slow difference signal and the frequency of the fast difference signal. The first set-reset latch 625 is reset when the up-down limit signal is high and set when the clock limit signal is high. The unlocked signal is ONE when the latch is reset and ZERO when the latch is set. When the frequency difference detector circuit is used in a reference clock generator circuit as illustrated in FIG. 1, an active unlocked signal UNLOCK indicates that the reference clock signal of the reference clock generator circuit is not within a small tolerance of the data rate of the serial input signal received by the reference clock generator circuit.

A second set-reset latch 631 determines whether the slow difference signal or the fast difference signal is at a faster rate. The second set-reset latch 631 is set by the up limit signal, which is from the slow counter 611 triggered by the slow difference signal. The second set-reset latch 631 is reset by the down limit signal, which is from the fast counter 613 triggered by the fast difference signal. A true output U of the second set-reset latch 631 is high when latch is set and a false output D is high when the latch is reset. Accordingly, the true output is high when the slow difference signal is at a high frequency and the false output is high when the fast difference signal is at a high frequency.

The up comparison signal is produced by a first selector 641, and the down comparison signal is produced by a second selector 643. Selection is controlled by the unlocked signal. When the unlocked signal is high, the first selector 641 outputs the true output U of the second set-reset latch 631, and the second selector 643 outputs the false output D of the second set-reset latch 631. When the unlocked signal is low, both selectors output a fixed value ONE causing both comparison signals to be asserted high. In other embodiments, the fixed value may be ZERO causing both comparison signals to be de-asserted. Accordingly, the up comparison signal is high and the down comparison signal is low when the slow difference signal is at a high frequency; the up comparison signal is low and the down comparison signal is high when the fast difference signal is at a high frequency; and the up comparison signal and the down comparison signal have the same value when neither the slow difference signal nor the fast difference signal is at a higher frequency than the feedback clock signal.

Figure 7:
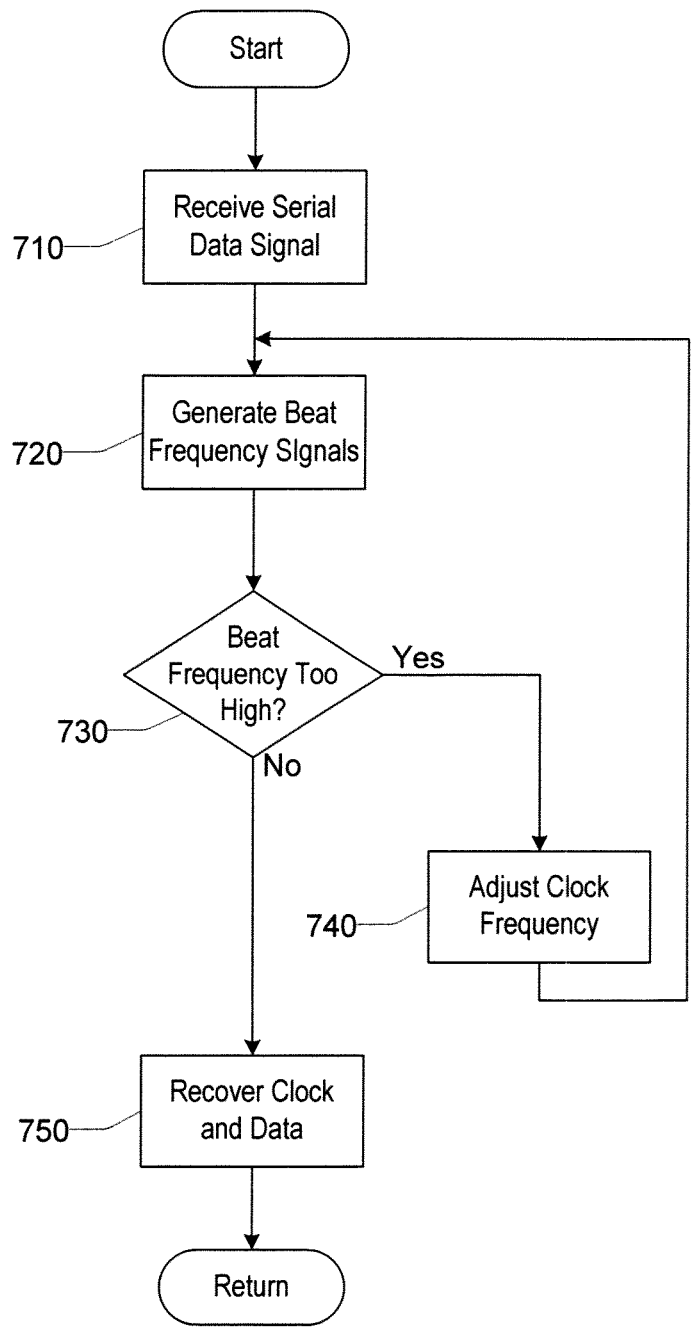
FIG. 7 is a flowchart of a process for clock and data recovery in accordance with aspects of the invention.

FIG. 7 is a flowchart of a process for clock and data recovery in accordance with aspects of the invention. In various embodiments, the process may be performed by circuitry for clock and data recovery without use of an external reference clock signal, for example, as described above with reference to FIG. 1, custom circuitry, programmable circuits, or a combination thereof. In many embodiments, the process is implemented by continuously running circuitry with data flowing through different portions of the circuitry at different times. The process receives a serial input signal and produces an output data signal and an associated clock signal.

In block 710, the process receives the serial data signal. The serial data signal may come from, for example, a fiber optic link. The serial data signal contains a stream of data values that are received periodically at a frequency termed a data rate. The data rate of a given serial data signal is substantially constant, although the process may receive different serial data signals having different data rates.

In block 720, the process generates beat frequency signals that indicate the difference between the frequency of an oscillator clock signal and the data rate of the serial data signal. The process may use a quadricorrelator circuit, for example, as described above with reference to FIG. 4, to perform block 720. The oscillator clock signal may be supplied by a voltage-controlled oscillator. In many embodiments, the process generates two beat frequency signals, one beat frequency signal that oscillates when the clock frequency is faster than the data rate and another beat frequency signal that oscillates when the clock frequency is slower than the data rate. The beat frequency signals oscillate at frequencies that are equal, or proportional, to the difference between the clock frequency and the data rate.

In block 730, the process determines whether the beat frequency generated in block 720 is too high. In most embodiments, the process compares the beat frequency to a divided version of the oscillator clock signal, for example, the oscillator clock signal divided down by 4000. When the beat frequency is higher than the divided down oscillator clock signal the process determines that the beat frequency is too high. If the beat frequency is too high, the process continues to block 740; otherwise, the process continues to block 750.

In block 740, the process adjusts the frequency of the oscillator clock signal. The frequency is adjusted in order to lower the beat frequency generated in block 720. For example, when the process generated the beat frequency signal that oscillates when the clock frequency is faster than the data rate in block 720, the process lowers the frequency of the oscillator clock signal. Thereafter, the process returns to block 720.

In block 750, the process produces an output data signal and an associated clock signal from the serial data signal. The output data signal contains the data values from the serial data signal. The associated clock signal switches synchronously with the output data signal. The process may use a clock and data recovery module, for example, as described above with reference to FIG. 1, to perform block 750. The process uses the oscillator clock signal, or in many embodiments, a divided down version of the oscillator clock signal, as a tuning or reference signal to initialize or constrain its operating frequencies.

Although the invention has been discussed with respect to various embodiments, it should be understood the invention comprises the novel and unobvious claims, and their insubstantial variations, supported by this disclosure.

The invention claimed is:

1. A clock and data recovery device, comprising:
reference clock generator circuitry configured to receive a serial data signal and to produce a first clock signal oscillating at a frequency substantially a sub-harmonic of a data rate of the serial data signal without utilizing an external reference clock signal; and
clock and data recovery circuitry configured to receive the serial data signal and the first clock signal and produce the data output signal representing data recovered from the serial data signal and the second clock signal that is synchronous with the data output signal,
wherein the reference clock generator circuitry comprises:
an oscillator configured to supply a third clock signal oscillating at a controlled frequency, wherein the reference clock generator circuitry utilizes the third clock signal to produce the first clock signal;
a beat frequency generator configured to receive the serial data signal and the third clock signal and produce a beat frequency indicator indicating a difference between the data rate of the serial input signal and the frequency of the third clock signal;
a first divider configured to receive the third clock signal and produce an output signal at a lower frequency; and
a frequency difference detector configured to compare a frequency of the output signal of the first divider and the beat frequency indicator and produce a frequency comparison indicator.

2. The clock and data recovery device of claim 1, wherein the oscillator is further configured to adjust the frequency of the third clock signal based on the frequency comparison indicator.

3. The clock and data recovery device of claim 1, further comprising a filter configured to filter the frequency comparison indicator and produce a frequency control signal, and
wherein the oscillator is further configured to control the frequency of the third clock signal utilizing the frequency control signal.

4. A clock and data recovery device, comprising:
reference clock generator circuitry configured to receive a serial data signal and to produce a first clock signal oscillating at a frequency substantially a sub-harmonic of a data rate of the serial data signal without utilizing an external reference clock signal; and
clock and data recovery circuitry configured to receive the serial data signal and the first clock signal and produce a data output signal representing data recovered from the serial data signal and a second clock signal that is synchronous with the data output signal;
wherein the reference clock generator circuitry comprises:

an oscillator configured to supply a third clock signal oscillating at a controlled frequency, wherein the reference clock generator circuitry utilizes the third clock signal to produce the first clock signal;

a beat frequency generator configured to receive the serial data signal and the third clock signal and produce a beat frequency indicator indicating a difference between the data rate of the serial input signal and the frequency of the third clock signal;

a first divider configured to receive the third clock signal and produce an output signal at a lower frequency; and a frequency difference detector configured to compare a frequency of the output signal of the first divider and the beat frequency indicator and produce a frequency comparison indicator; and a difference signal oscillating at a frequency substantially proportional to the difference between the data rate of the serial data signal and the frequency of the third clock signal; and an indicator of whether the data rate of the serial data signal or the frequency of the third clock signal is greater.

5. A clock and data recovery device, comprising:

reference clock generator circuitry configured to receive a serial data signal and to produce a first clock signal oscillating at a frequency substantially proportional to a data rate of the serial data signal without utilizing an external reference clock signal; and clock and data recovery circuitry configured to receive the serial data signal and the first clock signal and produce a data output signal representing data recovered from the serial data signal and a second clock signal that is synchronous with the data output signal;

wherein the reference clock generator circuitry comprises:
an oscillator configured to supply a third clock signal oscillating at a controlled frequency, wherein the reference clock generator circuitry utilizes the third clock signal to produce the first clock signal;

a beat frequency generator configured to receive the serial data signal and the third clock signal and produce a beat frequency indicator indicating a difference between the data rate of the serial input signal and the frequency of the third clock signal;

a first divider configured to receive the third clock signal and produce an output signal at a lower frequency; and a frequency difference detector configured to compare a frequency of the output signal of the first divider and the beat frequency indicator and produce a frequency comparison indicator; and wherein the beat frequency indicator comprises:
a fast difference signal oscillating at a frequency substantially proportional to the frequency of the third clock signal minus the data rate of the serial data signal when the frequency of the third clock signal is higher than the data rate of the serial data signal; and a slow difference signal oscillating at a frequency substantially proportional to the data rate of the serial data signal minus the frequency of the third clock signal when the frequency of the data rate of the serial data signal is higher than the third clock signal.

6. The clock and data recovery device of claim 5, wherein the beat frequency generator comprises a quadricorrelator.

7. The clock and data recovery device of claim 6, wherein the third clock signal comprises an in-phase clock signal and a quadrature clock signal, and wherein the quadricorrelator comprises:

a first flip-flop configured to sample the in-phase clock signal on rising edges of the serial data signal to produce an in-phase sample signal;

a second flip-flop configured to sample the quadrature clock signal on rising edges of the serial data signal to produce a quadrature sample signal; and circuitry configured to generate the fast difference signal and the slow difference signal utilizing the in-phase sample signal and the quadrature sample signal.

8. The clock and data recovery device of claim 7, wherein the circuitry configured to generate the fast difference signal and slow difference signal comprises:

a mobius circuit configured to shift a signal according to the sequence of the in-phase sample signal and the quadrature sample signal; and circuitry configured to receive signals from the mobius circuit and produce the slow difference signal that pulses when the data rate of the serial data signal is higher than frequency of the third clock signal and the fast difference signal that pulses when than frequency of the third clock signal is higher the data rate of the serial data signal.

9. A clock and data recovery device, comprising:

reference clock generator circuitry configured to receive a serial data signal and to produce a first clock signal oscillating at a frequency substantially a sub-harmonic of a data rate of the serial data signal without utilizing an external reference clock signal; and clock and data recovery circuitry configured to receive the serial data signal and the first clock signal and produce a data output signal representing data recovered from the serial data signal and a second clock signal that is synchronous with the data output signal;

wherein the reference clock generator circuitry comprises:
an oscillator configured to supply a third clock signal oscillating at a controlled frequency, wherein the reference clock generator circuitry utilizes the third clock signal to produce the first clock signal;

a beat frequency generator configured to receive the serial data signal and the third clock signal and produce a beat frequency indicator indicating a difference between the data rate of the serial input signal and the frequency of the third clock signal;

a first divider configured to receive the third clock signal and produce an output signal at a lower frequency; and a frequency difference detector configured to compare a frequency of the output signal of the first divider and the beat frequency indicator and produce a frequency comparison indicator; and wherein the reference clock generator circuitry further comprises a second divider configured to receive the third clock signal and produce the first clock signal at a lower frequency.

10. A clock and data recovery device, comprising:

reference clock generator circuitry configured to receive a serial data signal and to produce a first clock signal oscillating at a frequency substantially a sub-harmonic of a data rate of the serial data signal without utilizing an external reference clock signal; and clock and data recovery circuitry configured to receive the serial data signal and the first clock signal and produce a data output signal representing data recovered from the serial data signal and a second clock signal that is synchronous with the data output signal;
wherein the reference clock generator circuitry comprises:
an oscillator configured to supply a third clock signal oscillating at a controlled frequency, wherein the reference clock generator circuitry utilizes the third clock signal to produce the first clock signal;
a beat frequency generator configured to receive the serial data signal and the third clock signal and produce a beat frequency indicator indicating a difference between the data rate of the serial input signal and the frequency of the third clock signal;
a first divider configured to receive the third clock signal and produce an output signal at a lower frequency; and
a frequency difference detector configured to compare a frequency of the output signal of the first divider and the beat frequency indicator and produce a frequency comparison indicator; and
wherein the frequency comparison indicator comprises:
an up comparison signal that signals that the frequency of the third clock signal is less than the data rate of the serial data signal; and
a down comparison signal that signals that the frequency of the third clock signal is greater than the data rate of the serial data signal.

11. The clock and data recovery device of claim 10, wherein the oscillator is further configured to increase the frequency of the third clock signal when the up comparison signal is active and the down comparison signal is inactive and to decrease the frequency of the third clock signal when the down comparison signal is active and the up comparison signal is inactive.

12. The clock and data recovery device of claim 10, wherein the frequency difference detector comprises:
a first counter configured to increment on rising edges of the fast difference signal, reset to zero when a reset signal is asserted, and assert an up limit signal when the counter reaches a maximum value;
a second counter configured to increment on rising edges of the slow difference signal, reset to zero when the reset signal is asserted, and assert a down limit signal when the counter reaches the maximum value;
a third counter configured to increment on rising edges of the output signal of the first divider, reset to zero when the reset signal is asserted, and assert a clock limit signal when the counter reaches the maximum value;
logic circuitry configured to assert the reset signal when any of the counters reaches the maximum value; and
circuitry configured to produce the up comparison signal and the down comparison signal utilizing the up limit signal, the down limit signal, and the clock limit signal.

13. The clock and data recovery device of claim 12, wherein the circuitry configured to produce the up comparison signal and the down comparison signal comprises:
a first set-reset latch configured to set when the clock limit signal is asserted, to reset when either the up limit signal or the down limit signal is asserted, and to produce an unlocked signal that is active when the latch is reset and inactive when the latch is set;
a second set-reset latch configured to set when the up reset signal is asserted and reset when the down reset signal is asserted; and
selection circuitry configured to supply, when the unlocked signal is inactive, the up comparison signal and the down comparison signal having the same value and to supply, when the unlocked signal is active, the up comparison signal that is active when the second set-reset latch is set and inactive when the second set-reset latch is reset and the down comparison signal that is active when the second set-reset latch is reset and inactive when the second set-reset latch is set.

14. A reference clock generator device, comprising:
a controlled oscillator configured to supply a first clock signal oscillating at a controlled frequency and utilized to produce a reference clock signal;
a beat frequency generator configured to receive a serial data signal and the first clock signal and produce a beat frequency indicator indicating a difference between the data rate of the serial data signal and the frequency of the first clock signal;
a first divider configured to receive the first clock signal and produce an output signal at a lower frequency;
a second divider configured to receive the first clock signal and produce the reference clock signal at a lower frequency; and
a frequency difference detector configured to compare a frequency of the output signal of the first divider and the beat frequency indicator and produce a frequency comparison indicator.

15. The reference clock generator device of claim 14, wherein the oscillator is further configured to adjust the frequency of the first clock signal based on the frequency comparison indicator.

16. The reference clock generator device of claim 14, further comprising a filter configured to filter the frequency comparison indicator and produce a frequency control signal, and
wherein the oscillator is further configured to control the frequency of the first clock signal utilizing the frequency control signal.

17. The reference clock generator device of claim 14, wherein the beat frequency indicator comprises:
a fast difference signal oscillating at a frequency proportional to the frequency of the first clock signal minus the data rate of the serial data signal when the frequency of the first clock signal is higher than the data rate of the serial data signal; and
a slow difference signal oscillating at a frequency proportional to the data rate of the serial data signal minus the frequency of the first clock signal when the frequency of the data rate of the serial data signal is higher than the first clock signal.

18. The reference clock generator device of claim 17, wherein the first clock signal comprises an in-phase clock signal and a quadrature clock signal, and wherein the beat frequency generator comprises:
a first flip-flop configured to sample the in-phase clock signal on rising edges of the serial data signal to produce an in-phase sample signal;
a second flip-flop configured to sample the quadrature clock signal on rising edges of the serial data signal to produce a quadrature sample signal; and
circuitry configured to generate the fast difference signal and the slow difference signal utilizing the in-phase sample signal and the quadrature sample signal.

19. The reference clock generator device of claim 18, wherein the circuitry configured to generate the fast difference signal and slow difference signal comprises:
a mobius circuit configured to shift a signal according to the sequence of the in-phase sample signal and the quadrature sample signal; and
circuitry configured to receive signals from the mobius circuit and produce the slow difference signal that pulses when the data rate of the serial data signal is higher than frequency of the first clock signal and the fast difference signal that pulses when than frequency of the first clock signal is higher the data rate of the serial data signal.

20. The reference clock generator device of claim 14, wherein the frequency comparison indicator comprises:
- an up comparison signal that signals that the frequency of the first clock signal is less than the data rate of the serial data signal;
- a down comparison signal that signals that the frequency of the first clock signal is greater than the data rate of the serial data signal; and
- wherein the oscillator is further configured to increase the frequency of the first clock signal when the up comparison signal is active and the down comparison signal is inactive and to decrease the frequency of the first clock signal when the down comparison signal is active and the up comparison signal is inactive.

21. The reference clock generator device of claim 20, wherein the frequency difference detector comprises:
- a first counter configured to increment on rising edges of the fast difference signal, reset to zero when a reset signal is asserted, and assert an up limit signal when the counter reaches a maximum value;
- a second counter configured to increment on rising edges of the slow difference signal, reset to zero when the reset signal is asserted, and assert a down limit signal when the counter reaches the maximum value;
- a third counter configured to increment on rising edges of the output signal of the first divider, reset to zero when the reset signal is asserted, and assert a clock limit signal when the counter reaches the maximum value;
- logic circuitry configured to assert the reset signal when any of the counters reaches the maximum value; and
- circuitry configured to produce the up comparison signal and the down comparison signal utilizing the up limit signal, the down limit signal, and the clock limit signal.

22. The reference clock generator device of claim 21, wherein the circuitry configured to produce the up comparison signal and the down comparison signal comprises:
- a first set-reset latch configured to set when the clock limit signal is asserted, to reset when either the up limit signal or the down reset signal is asserted, and to produce an unlocked signal that is active when the latch is reset and inactive when the latch is set;
- a second set-reset latch configured to set when the up reset signal is asserted and reset when the down reset signal is asserted; and
- selection circuitry configured to supply, when the unlocked signal is inactive, the up comparison signal and the down comparison signal having the same value and to supply, when the unlocked signal is active, the up comparison signal that is active when the second set-reset latch is set and inactive when the second set-reset latch is reset and the down comparison signal that is active when the second set-reset latch is reset and inactive when the second set-reset latch is set.

23. A method for use in recovering clock and data from a serial input signal, comprising:
- generating a variable clock signal oscillating at a frequency;
- dividing down the variable clock signal to produce a feedback clock signal oscillating at a lower frequency than the frequency of the variable clock signal;
- generating a beat frequency indicator indicating a difference between a data rate of the serial input signal and the frequency of the variable clock signal;
- comparing the frequency of the feedback clock signal to the beat frequency indicator to produce a frequency comparison indicator; and
- conditionally adjusting the frequency of the variable clock signal based on the frequency comparison indicator, wherein conditionally adjusting the frequency of the variable clock signal comprises adjusting the frequency of the variable clock signal when the frequency comparison indicator indicates that a magnitude of the beat frequency indicator is greater than the frequency of the feedback clock signal.

24. The method of claim 23, further comprising:
- recovering data values from the serial data signal utilizing the variable clock signal as a reference signal.

25. The method of claim 23, wherein the beat frequency indicator comprises an indicator of a magnitude of the frequency difference between the data rate of the serial input signal and the frequency of the variable clock signal and an indicator of whether the frequency of the variable clock signal is greater than or less than the data rate of the serial input signal.

26. The method of claim 25, wherein adjusting the frequency of the variable clock signal when the frequency comparison indicator indicates that the magnitude of the beat frequency indicator is greater than the frequency of the feedback clock signal comprises:
- increasing the frequency of the variable clock signal when beat frequency indicator indicates that the frequency of the variable clock signal is less than the data rate of the serial input signal; and
- decreasing the frequency of the variable clock signal when beat frequency indicator indicates that the frequency of the variable clock signal is greater than the data rate of the serial input signal.

* * * * *

UNITED STATES PATENT AND TRADEMARK OFFICE
CERTIFICATE OF CORRECTION

PATENT NO.       : 8,798,223 B2
APPLICATION NO.  : 12/977995
DATED            : August 5, 2014
INVENTOR(S)      : Ashish K. Choudhury It is certified that error appears in the above-identified patent and that said Letters Patent is hereby corrected as shown below:

In the Specification

In column 8, line 61, delete "its" and insert --its maximum--, therefor.

Signed and Sealed this
Fifth Day of May, 2015

Michelle K. Lee
*Director of the United States Patent and Trademark Office*